(12) United States Patent
Oku et al.

(10) Patent No.: US 8,791,652 B2
(45) Date of Patent: Jul. 29, 2014

(54) SIGNAL SHAPING CIRCUIT

(75) Inventors: Hideki Oku, Kawasaki (JP); Yukito Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 186 days.

(21) Appl. No.: 13/330,299

(22) Filed: Dec. 19, 2011

(65) Prior Publication Data

US 2012/0235727 A1 Sep. 20, 2012

(30) Foreign Application Priority Data

Mar. 17, 2011 (JP) .................................. 2011-059858

(51) Int. Cl.
*H03L 5/00* (2006.01)
*H05B 37/02* (2006.01)

(52) U.S. Cl.
USPC ............. 315/297; 326/89; 327/306; 330/279; 330/280

(58) Field of Classification Search
USPC ................ 315/297, 294, 307; 326/83, 89, 90; 327/306; 330/279, 254, 285, 280
See application file for complete search history.

(56) References Cited

U.S. PATENT DOCUMENTS

| | | | |
|---|---|---|---|
| 6,750,717 B1 * | 6/2004 | Kobayashi et al. | 330/279 |
| 6,792,019 B2 * | 9/2004 | Fattaruso | 372/38.07 |
| 8,041,552 B2 * | 10/2011 | Pilling | 703/14 |
| 2006/0280239 A1 | 12/2006 | Moll et al. | |
| 2007/0046332 A1 * | 3/2007 | Tanaka | 326/83 |
| 2008/0137721 A1 * | 6/2008 | Hsu et al. | 375/231 |
| 2010/0060325 A1 | 3/2010 | Matsumoto et al. | |

FOREIGN PATENT DOCUMENTS

| | | |
|---|---|---|
| JP | 2006-345532 | 12/2006 |
| JP | 2007-081608 A | 3/2007 |
| JP | 2008-211620 | 9/2008 |
| JP | 2008-219895 A | 9/2008 |

OTHER PUBLICATIONS

JPOA—Office Action of Japan Patent Application 2011-059858 dated Jun. 3, 2014. Translation of the relevant part, p. 1, line 1 to p. 2, line 7, of the Office Action.

* cited by examiner

*Primary Examiner* — Daniel D Chang
(74) *Attorney, Agent, or Firm* — Fujitsu Patent Center

(57) ABSTRACT

A signal shaping circuit that shapes a drive signal and includes a main-signal amplifying circuit that amplifies the drive signal; a preemphasis generating circuit that symmetrically emphasizes a rising portion and a falling portion of the drive signal; a current source that is provided in the main-signal amplifying circuit; and a condenser that couples the main-signal amplifying circuit and the preemphasis generating circuit.

20 Claims, 16 Drawing Sheets

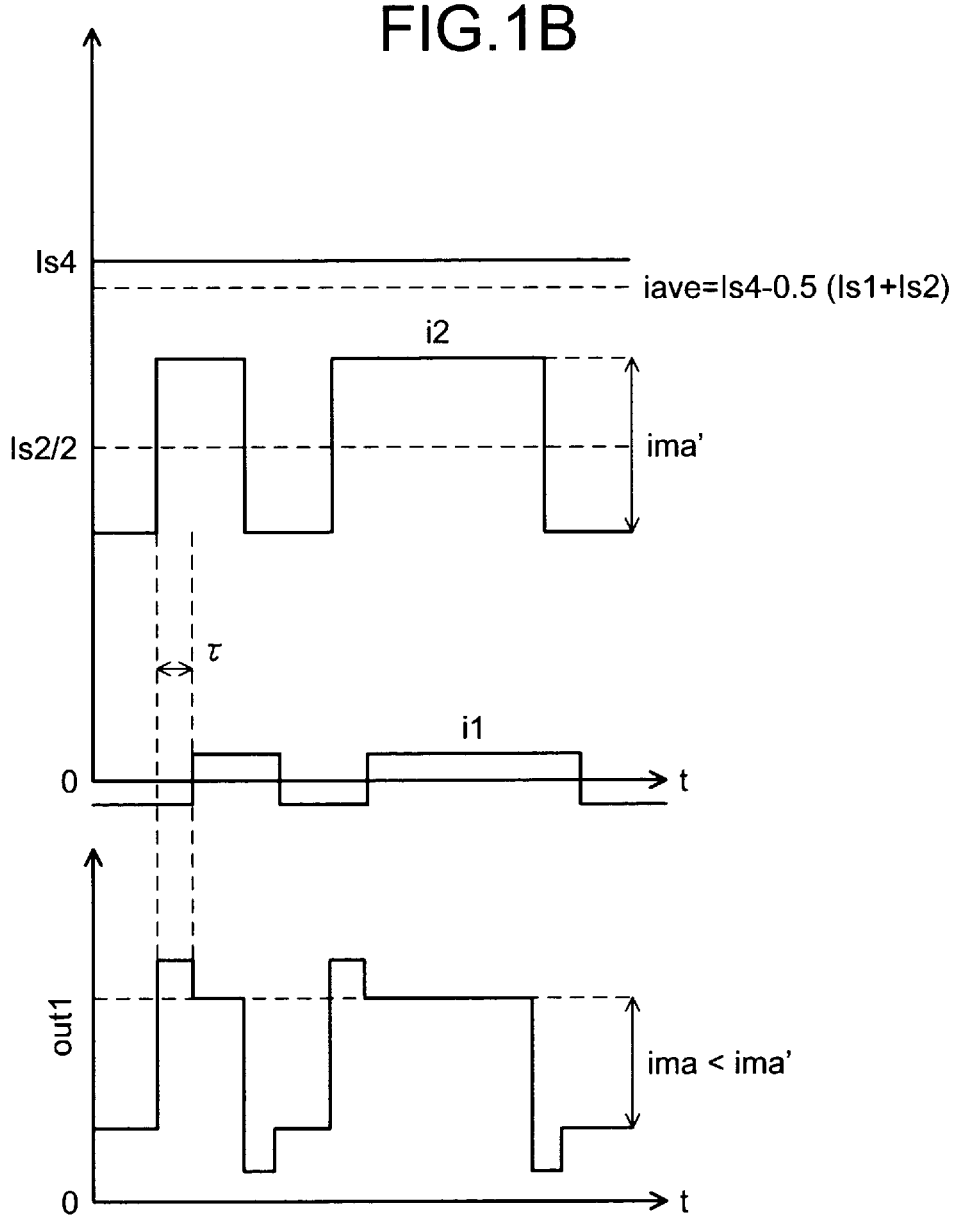

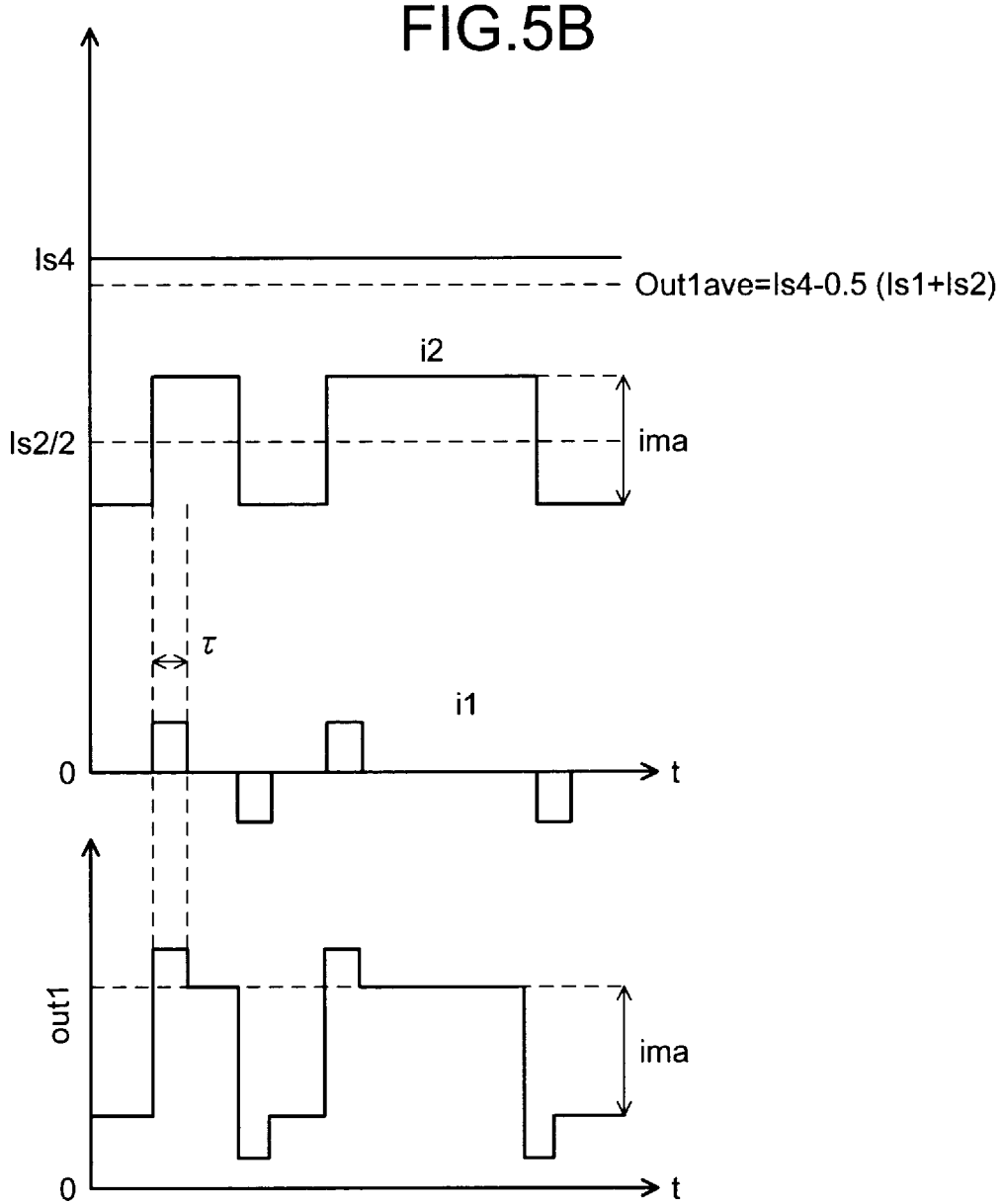

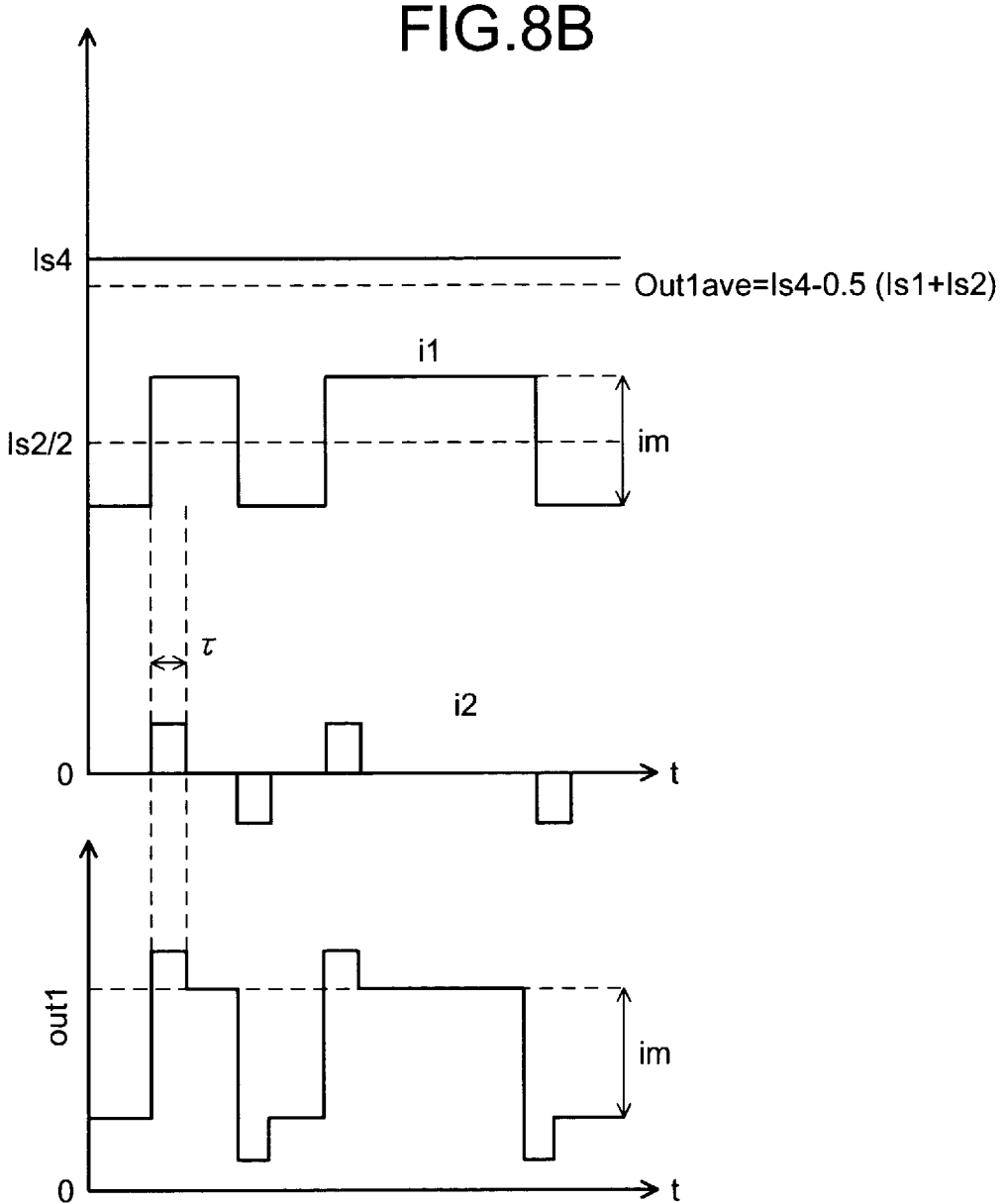

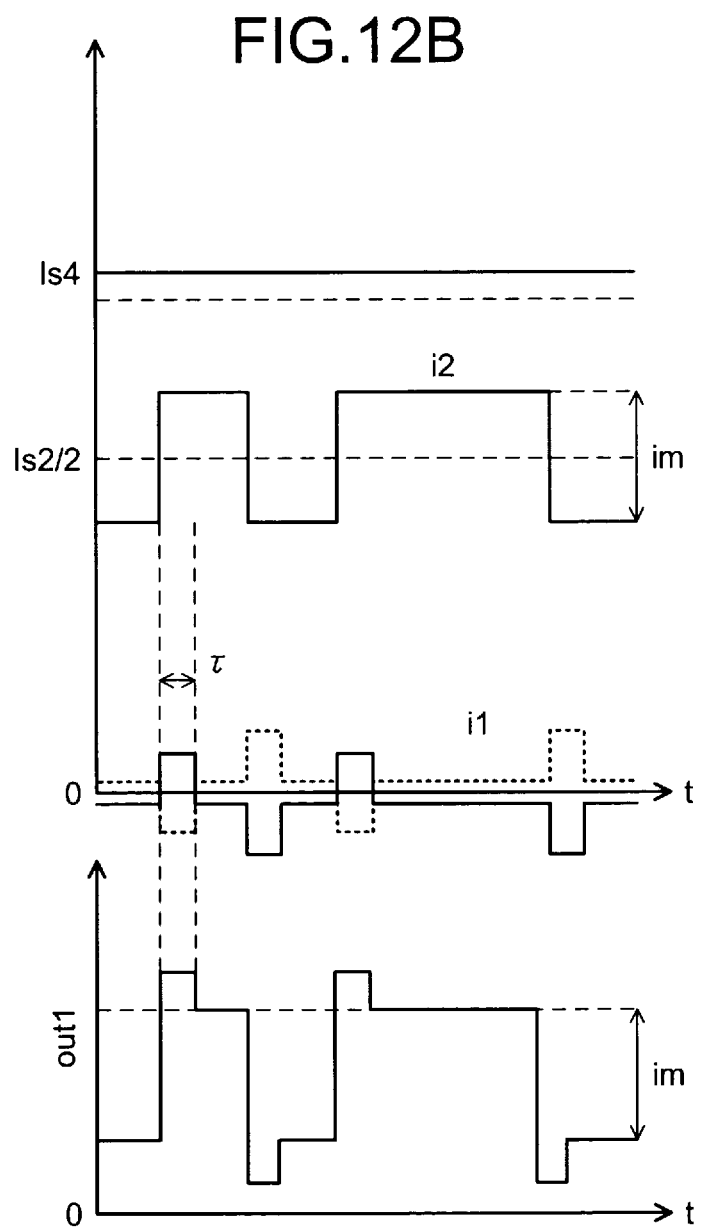

US 8,791,652 B2

SIGNAL SHAPING CIRCUIT

CROSS REFERENCE TO RELATED APPLICATIONS

This application is based upon and claims the benefit of priority of the prior Japanese Patent Application No. 2011-059858, filed on Mar. 17, 2011, the entire contents of which are incorporated herein by reference.

FIELD

The embodiments discussed herein are related to a signal shaping circuit that shapes a drive signal.

BACKGROUND

Data transmission speed between racks, between boards, and within a board has recently increased along with a significant improvement of performance of central processing units (CPU) of information processing apparatuses and/or communication apparatuses (e.g., high-end servers), whereas increase of speed in conventional electrical wirings has come close to its limit. Thus, optical interconnect technology enabling higher-speed data transmission has been considered.

In high-speed optical interconnect, a light-emitting element is directly modulated to transmit an optical signal on the transmitting side, and a light-receiving element receives the optical signal and converts it to an electrical signal on the receiving side. However, the light-emitting element driven at a high speed causes waveform deterioration such as eye closing due to relaxation oscillation of the light-emitting element and/or bandwidth limitation, thereby deteriorating transmission quality. To cope with this, preemphasis for correcting (emphasizing or suppressing) in advance the rising portion and the falling portion of a drive signal for the light-emitting element is known.

A preemphasis generating circuit divides an input signal into two, and includes a main-signal amplifying circuit and a current subtraction circuit that delays the input signal. The main-signal amplifying circuit includes a differential pair of transistors, a current source, and a current supplying source. The current subtraction circuit includes a differential pair of transistors that amplifies a differential signal delayed for preemphasis, and obtains a preemphasis component based on the difference between the input signal and the delay component. A preemphasis signal is obtained by the main-signal amplifying circuit and the current subtraction circuit (see, for example, Japanese Laid-Open Patent Publication Nos. 2007-81608 and 2008-219895).

However, the current supplying source of the conventional preemphasis generating circuit supplies a current to the preemphasis generating circuit in addition to the main-signal amplifying circuit. Thus, a transistor included in such a high-power current supplying source requires a high maximum rated current, thereby increasing parasitic capacitance and preventing high-speed operation. The entire power consumption increases if current supplying sources are provided for the main-signal amplifying circuit and the preemphasis generating circuit, respectively.

SUMMARY

According to an aspect of an embodiment, a signal shaping circuit that shapes a drive signal and includes a main-signal amplifying circuit that amplifies the drive signal; a preemphasis generating circuit that symmetrically emphasizes a rising portion and a falling portion of the drive signal; a current source that is provided in the main-signal amplifying circuit; and a condenser that couples the main-signal amplifying circuit and the preemphasis generating circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1B is a waveform diagram of currents at given positions in FIG. 1A.

FIG. 5B is a waveform diagram of currents at given positions in FIG. 5A.

FIG. 8B is a waveform diagram of currents at given positions in FIG. 8A.

FIG. 12B is a waveform diagram of currents at given positions in FIG. 12A.

DESCRIPTION OF EMBODIMENTS

Preferred embodiments of the technology disclosed herein are described in detail below with reference to the accompanying drawings.

Figure 1A:
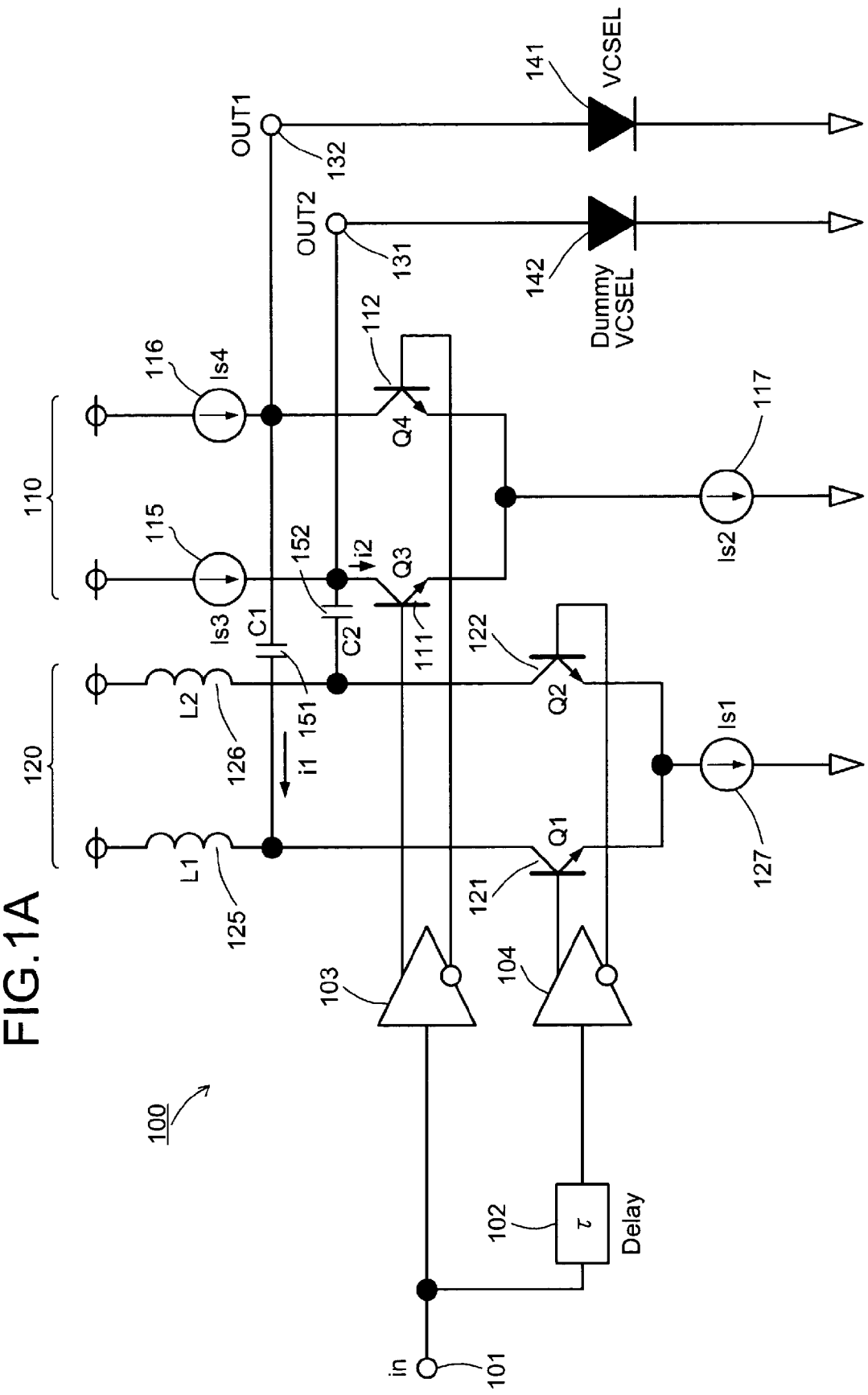
FIG. 1A is a circuit diagram of a signal shaping circuit according to a first embodiment.

FIG. 1A is a circuit diagram of a signal shaping circuit according to a first embodiment. A signal shaping circuit 100 includes an input terminal 101, a delay unit 102, amplifiers 103 and 104, a main-signal amplifying circuit 110, a preemphasis generating circuit 120, and output terminals 131 and 132.

For example, the anode of a light-emitting element 141 to be driven as a load is connected to the output terminal 132, and the anode of a dummy light-emitting element 142 having characteristics equivalent to the light-emitting element 141 is connected to the output terminal 131. The signal shaping circuit 100 is of anode-driving type and drives the anode of the light-emitting element. An LD such as a vertical cavity surface emitting laser (VCSEL) is used as the light-emitting element 141.

A drive signal input from the input terminal 101 is divided into two, one of which is input to the amplifier 103 and the other is input to the amplifier 104 via the delay unit 102. The amplifier 103 outputs plus and minus outputs to the main-signal amplifying circuit 110. The amplifier 104 outputs plus and minus outputs to the preemphasis generating circuit 120. The delay unit 102 delays the drive signal input from the input terminal 101 by a given delay amount τ, and outputs the delayed drive signal to the preemphasis generating circuit 120 via the amplifier 104.

The main-signal amplifying circuit 110 is a differential amplifier and includes transistors 111 and 112, current sources (bias current sources) 115 and 116, and a current source 117.

The non-inverted signal output from the amplifier 103 is applied to the base of the transistor 111. The collector of the transistor 111 is connected to the current source 115 and the output terminal 131. The emitter of the transistor 111 is connected to the current source 117.

The inverted signal output from the amplifier 103 is applied to the base of the transistor 112. The collector of the transistor 112 is connected to the current source 116 and the output terminal 132. The emitter of the transistor 112 is connected to the current source 117.

The preemphasis generating circuit 120 is a differential amplifier and includes transistors 121 and 122, inductances 125 and 126, and a current source 127.

The non-inverted signal output from the amplifier 104 is applied to the base of the transistor 121. The collector of the transistor 121 is connected to the inductance 125, and to the current source 116 of the main-signal amplifying circuit 110 via a condenser 151. The emitter of the transistor 121 is connected to the current source 127.

The inverted signal output from the amplifier 104 is applied to the base of the transistor 122. The collector of the transistor 122 is connected to the inductance 126, and to the current source 115 of the main-signal amplifying circuit 110 via a condenser 152. The emitter of the transistor 122 is connected to the current source 127.

As described above, the preemphasis generating circuit 120 is AC-coupled to the main-signal amplifying circuit 110 via the condensers 151 and 152 in the first embodiment.

FIG. 1B is a waveform diagram of currents at given positions in FIG. 1A. Currents on the side of the current source 116 (and the transistor 112) are depicted. The difference between the current i2 and the current i1 (i2−i1) depicted in FIG. 1A is output from the output terminal 132. The DC of the current i1 is eliminated by the condenser 151.

Figure 2:
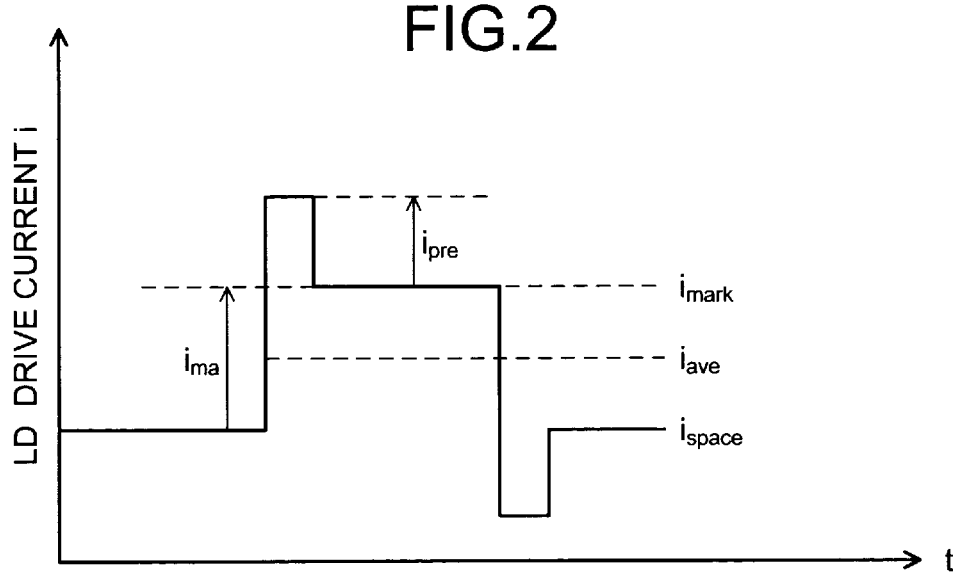
FIG. 2 is a diagram for explaining definitions concerning a waveform of a current.

FIG. 2 is a diagram for explaining definitions concerning a waveform of a current. The horizontal axis of FIG. 2 represents time, and the vertical axis represents LD drive current. As depicted in FIG. 2, with respect to current i, ima represents the amount of amplitude, ipre represents the amount of amplitude for preemphasis, iave represents the average current value, and imark and ispace represent the maximum value and the minimum value of the amplitude, respectively. The extinction ratio ER=imark/ispace, the average current iave=(ispace+imark)/2, and the amount of preemphasis PRE=ipre/ima.

The amount of current of the current source 116 is described when ER=2 (3 dB) or 3.2 (5 dB), PRE=40%, and ima=5 mA in the first embodiment.

$$iave = Is4 - Is2/2$$

$$ima = Is2 = 2iave \cdot (ER-1)/(ER+1)$$

$$PRE = Is1/ima$$

Thus, Is4=ima·(ER)/(ER−1), that is,
Is4=10 mA when ER=2
Is4=7.27 mA when ER=3.2.

A configuration different from the first embodiment is taken as a comparison example. That is, if the preemphasis generating circuit is not AC-coupled to the main-signal amplifying circuit via the condensers (i.e., if the preemphasis generating circuit is directly coupled to the main-signal amplifying circuit), $$iave = Is4 - 1/2(Is1 + Is2)$$

$$ima = Is2 - Is1 = 2iave \cdot (ER-1)/(ER+1)$$

$$PRE = Is1/ima$$

Thus, Is4=ima[PRE+((ER)/(ER−1))], that is,
Is4=12mA when ER=2
Is4=9.27 mA when ER=3.2.
Thus, the first embodiment can achieve about 17% (when ER=2) to 22% (when ER=3.2) increase in speed compared to the conventional technology where the preemphasis generating circuit is not AC-coupled to the main-signal amplifying circuit via the condensers.

According to the configuration described above, a preemphasis signal having a waveform with emphasized rise and fall can be generated by inducing the delay amount τ set by the delay unit 102 and subtracting data output from the preemphasis generating circuit 120 from data output from the main-signal amplifying circuit 110 at a given ratio.

Since the inductances 125 and 126 are used as loads of the preemphasis generating circuit 120 and the preemphasis generating circuit 120 is AC-coupled to the main-signal amplifying circuit 110 via the condensers 151 and 152, it is sufficient for the current sources 115 and 116 to supply direct currents only to the transistors 111 and 112.

Thus, a transistor of a low maximum rated current can be used as the transistors 111 and 112, thereby decreasing the parasitic capacitance of the transistors 111 and 112. Thus, a high-speed preemphasis generating circuit can be obtained.

Figure 3:
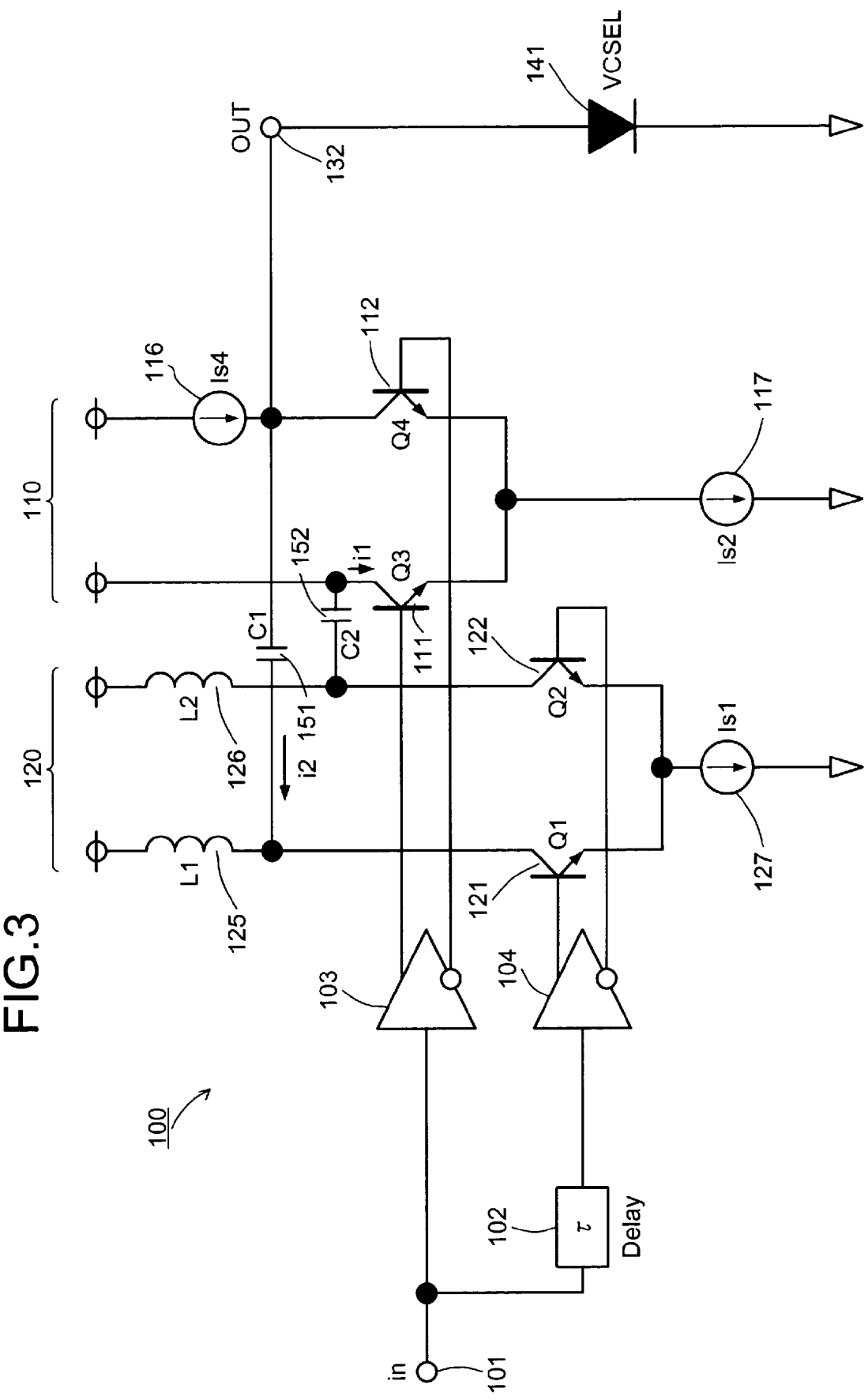
FIG. 3 is a circuit diagram of a modification of the signal shaping circuit according to the first embodiment.

FIG. 3 is a circuit diagram of a modification of the signal shaping circuit according to the first embodiment. In FIG. 3, only one current source 116 and one output terminal 132 are provided to drive the light-emitting element 141 to be driven. That is, the current source 115 is short-circuited to the power source (the current source 115 is not provided). Configuration except above is the same as FIG. 1A. Reduced power consumption and reduced cost due to a reduced number of elements can be achieved by not providing the current source 115 depicted in FIG. 1A, while achieving the increase in operation speed similar to that of FIG. 1A.

Figure 4:
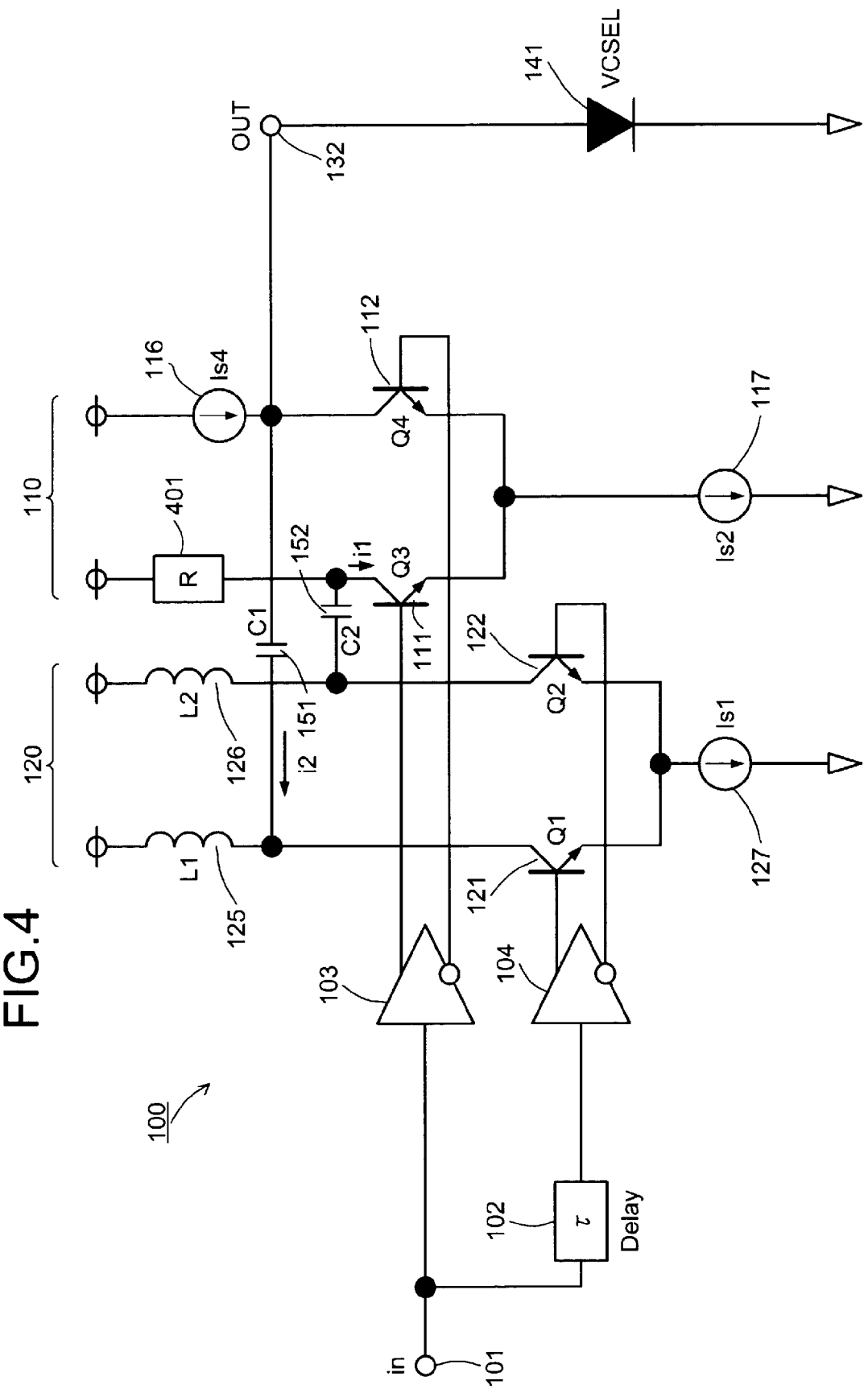
FIG. 4 is a circuit diagram of a modification of the signal shaping circuit according to the first embodiment.

FIG. 4 is a circuit diagram of a modification of the signal shaping circuit according to the first embodiment. In FIG. 4, only one current source 116 and one output terminal 132 are provided to drive the light-emitting element 141 to be driven. Further, a resistor 401 is provided in place of the current source 115 depicted in FIG. 1A. Configuration except above is the same as FIG. 1A. Reduced power consumption and reduced cost due to a reduced number of elements can be achieved by not providing the current source 115 depicted in FIG. 1A. Further, the resistor 401 provided on one of the differential pair and the light-emitting element 141 connected to the output terminal 132 as a load can be balanced, while achieving the increase in operation speed similar to that of FIG. 1A.

Figure 5A:
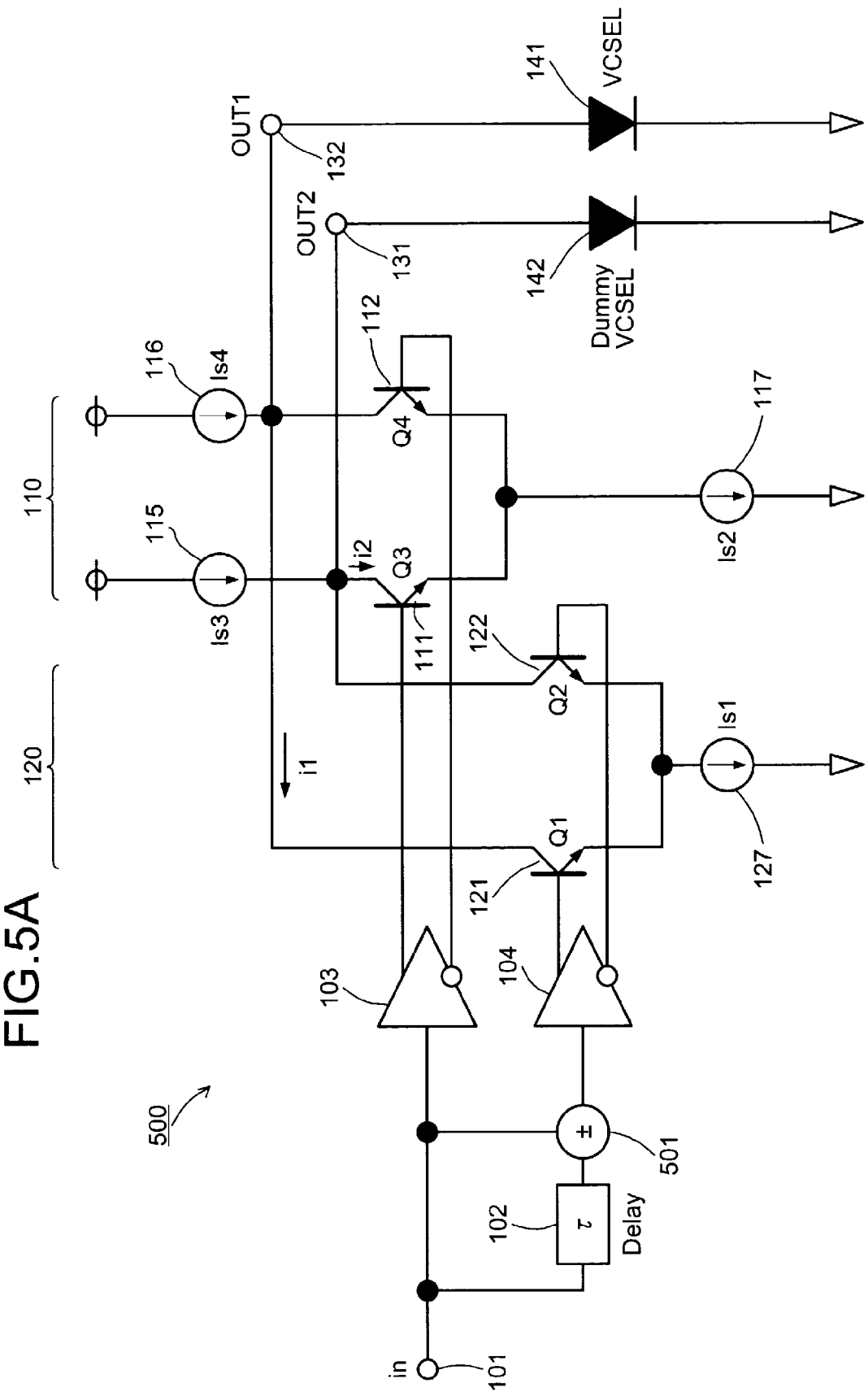
FIG. 5A is a circuit diagram of a signal shaping circuit according to a second embodiment.

FIG. 5A is a circuit diagram of a signal shaping circuit according to a second embodiment. A signal shaping circuit 500 includes the input terminal 101, the delay unit 102, the amplifiers 103 and 104, the main-signal amplifying circuit 110, the preemphasis generating circuit 120, the output terminals 131 and 132, and a subtracting unit 501.

The input terminal 101 and the output of the delay unit 102 are connected and input to the subtracting unit 501. Thus, the delay signal from the delay unit 102 is subtracted from the input drive signal. The preemphasis generating circuit 120 generates the emphasis signal added to the main signal of the main-signal amplifying circuit 110.

The anode of the light-emitting element 141 to be driven is connected to the output terminal 132, and the dummy light-emitting element 142 having characteristics equivalent to the light-emitting element 141 or a dummy circuit equivalent to a light-emitting element is connected to the output terminal 131.

The amplifier 103 outputs plus and minus outputs to the main-signal amplifying circuit 110. The delay unit 102 delays the drive signal input from the input terminal 101 by a given delay amount τ, and outputs the delayed drive signal to the subtracting unit 501 that subtracts the delay signal input from the delay unit 102 from the input drive signal. The amplifier 104 outputs plus and minus outputs to the preemphasis generating circuit 120.

The main-signal amplifying circuit 110 is a differential amplifier and includes the transistors 111 and 112, the current sources (bias current sources) 115 and 116, and the current source 117.

The non-inverted signal output from the amplifier 103 is applied to the base of the transistor 111. The collector of the transistor 111 is connected to the current source 115 and the output terminal 131. The emitter of the transistor 111 is connected to the current source 117.

The inverted signal output from the amplifier 103 is applied to the base of the transistor 112. The collector of the transistor 112 is connected to the current source 116 and the output terminal 132. The emitter of the transistor 112 is connected to the current source 117.

The preemphasis generating circuit 120 is a differential amplifier and includes the transistors 121 and 122, the inductances 125 and 126, and the current source 127.

The non-inverted signal output from the amplifier 104 is applied to the base of the transistor 121. The collector of the transistor 121 is connected to the current source 116 of the main-signal amplifying circuit 110. The emitter of the transistor 121 is connected to the current source 127.

The inverted signal output from the amplifier 104 is applied to the base of the transistor 122. The collector of the transistor 112 is connected to the current source 115 of the main-signal amplifying circuit 110. The emitter of the transistor 122 is connected to the current source 127.

As described above, the preemphasis generating circuit 120 generates the emphasis signal added to the main signal of the main-signal amplifying circuit 110 in the second embodiment.

FIG. 5B is a waveform diagram of currents at given positions in FIG. 5A. Currents on the side of the current source 116 (and the transistor 112) are depicted. A current obtained by adding the current i1 (current emphasis component) and the current i2 (main-signal component) (i1+i2) depicted in FIG. 5B is output from the output terminal 132. The addition of the emphasis component enables the current Is4 of the current source 116 to be driven by a bias current smaller than the conventional technology.

That is, assuming that the average current of the light-emitting element 141 is Is4−0.5(Is1+Is2), the modulation current of the light-emitting element 141 is Is1, and the emphasis current is Is2, the bias current Is4 of the current source 116 is represented by Is4=Is4−0.5·s2. On the other hand, assuming the average current of the light-emitting element 141 is Is4−0.5(Is1+Is2), the modulation current of the light-emitting element 141 is Is1−Is2, and the emphasis current is Is2 in the configuration where the input signal is delayed, the bias current Is4 of the current source 116 is represented by Is4=Is4−0.5·Is2. Thus, the bias current Is4 of the current source 116 can be reduced by 0.5·s2 in the second embodiment.

Figure 6:
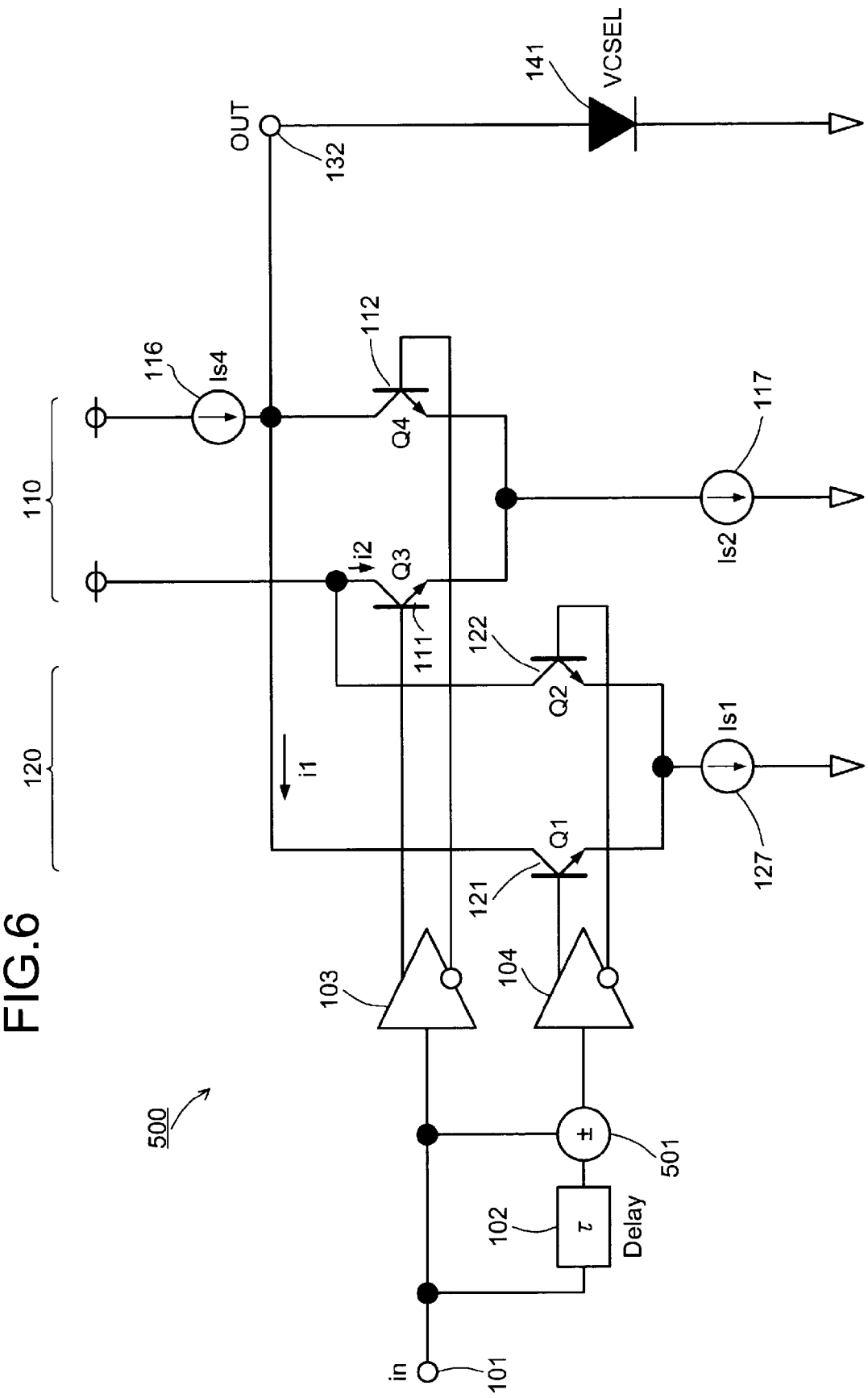
FIG. 6 is a circuit diagram of a modification of the signal shaping circuit according to the second embodiment.

FIG. 6 is a circuit diagram of a modification of the signal shaping circuit according to the second embodiment. In FIG. 6, only one current source 116 and one output terminal 132 are provided to drive the light-emitting element 141 to be driven. Configuration except above is the same as FIG. 5A. Reduced power consumption and reduced cost due to a reduced number of elements can be achieved by not providing the current source 115 depicted in FIG. 5A, while achieving the increase in operation speed similar to that of FIG. 5A.

Figure 7:
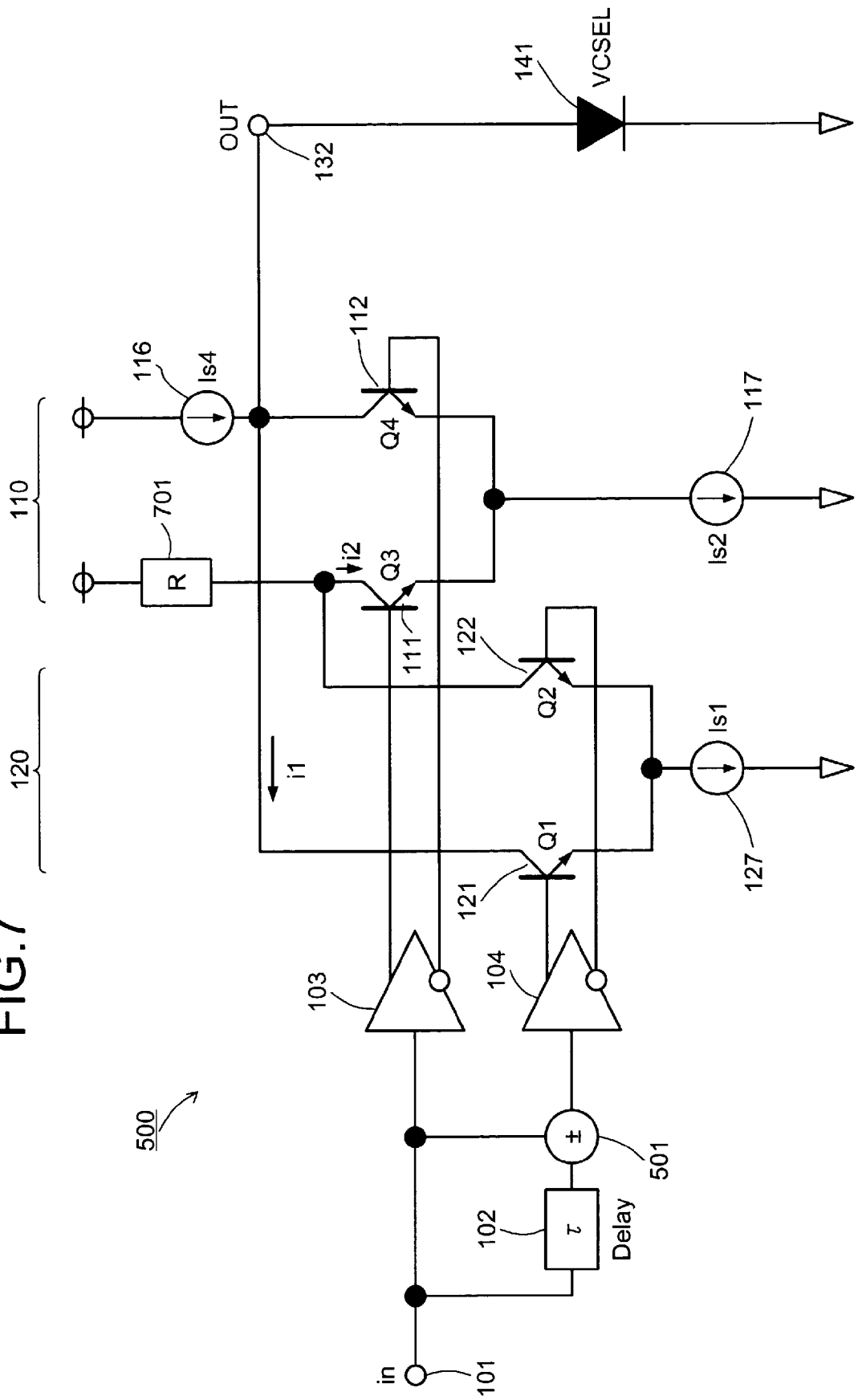
FIG. 7 is a circuit diagram of a modification of the signal shaping circuit according to the second embodiment.

FIG. 7 is a circuit diagram of a modification of the signal shaping circuit according to the second embodiment. In FIG. 7, only one current source 116 and one output terminal 132 are provided to drive the light-emitting element 141 to be driven. Further, a resistor 701 is provided in place of the current source 115 depicted in FIG. 5A. Configuration except above is the same as FIG. 5A. Reduced power consumption and reduced cost due to a reduced number of elements can be achieved by not providing the current source 115 depicted in FIG. 5A.

Further, the resistor 701 provided on one of the differential pair and the light-emitting element 141 connected to the output terminal 132 as a load can be balanced. Furthermore, the design of the voltage between the collector and the emitter of the transistor 111 can be facilitated, while achieving the increase in operation speed similar to that of FIG. 5A.

Figure 8A:
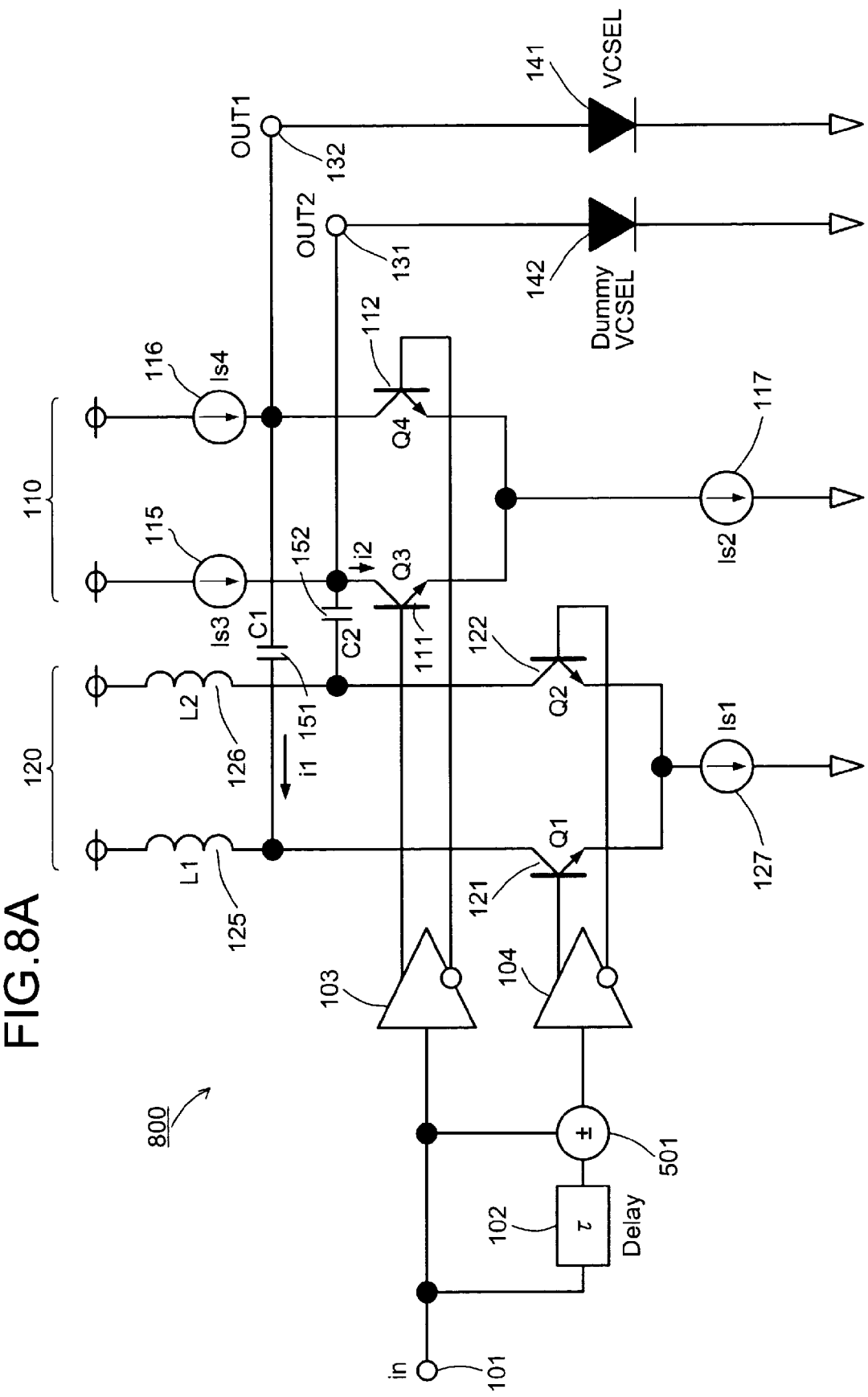
FIG. 8A is a circuit diagram of a signal shaping circuit according to a third embodiment.

FIG. 8A is a circuit diagram of a signal shaping circuit according to a third embodiment. The configuration is a combination of that of the first embodiment (FIG. 1A) and that of the second embodiment (FIG. 5A). In a signal shaping circuit 800 depicted in FIG. 8A, the preemphasis generating circuit 120 is AC-coupled to the main-signal amplifying circuit 110 via the condensers 151 and 152.

The input terminal 101 and the output of the delay unit 102 are connected and input to the subtracting unit 501. Thus, the delay signal from the delay unit 102 is subtracted from the input drive signal. The preemphasis generating circuit 120 generates the emphasis signal added to the main signal of the main-signal amplifying circuit 110.

FIG. 8B is a waveform diagram of currents at given positions in FIG. 8A. According to the third embodiment, the size of the current source 116 (Is4) can be made smaller than those of the first and the second embodiments, thereby further increasing the speed. The signal i1 (emphasis component) generated according to the second embodiment includes many high-frequency components, and thus passes the condenser C1 having a low cut-off frequency more easily.

Figure 9:
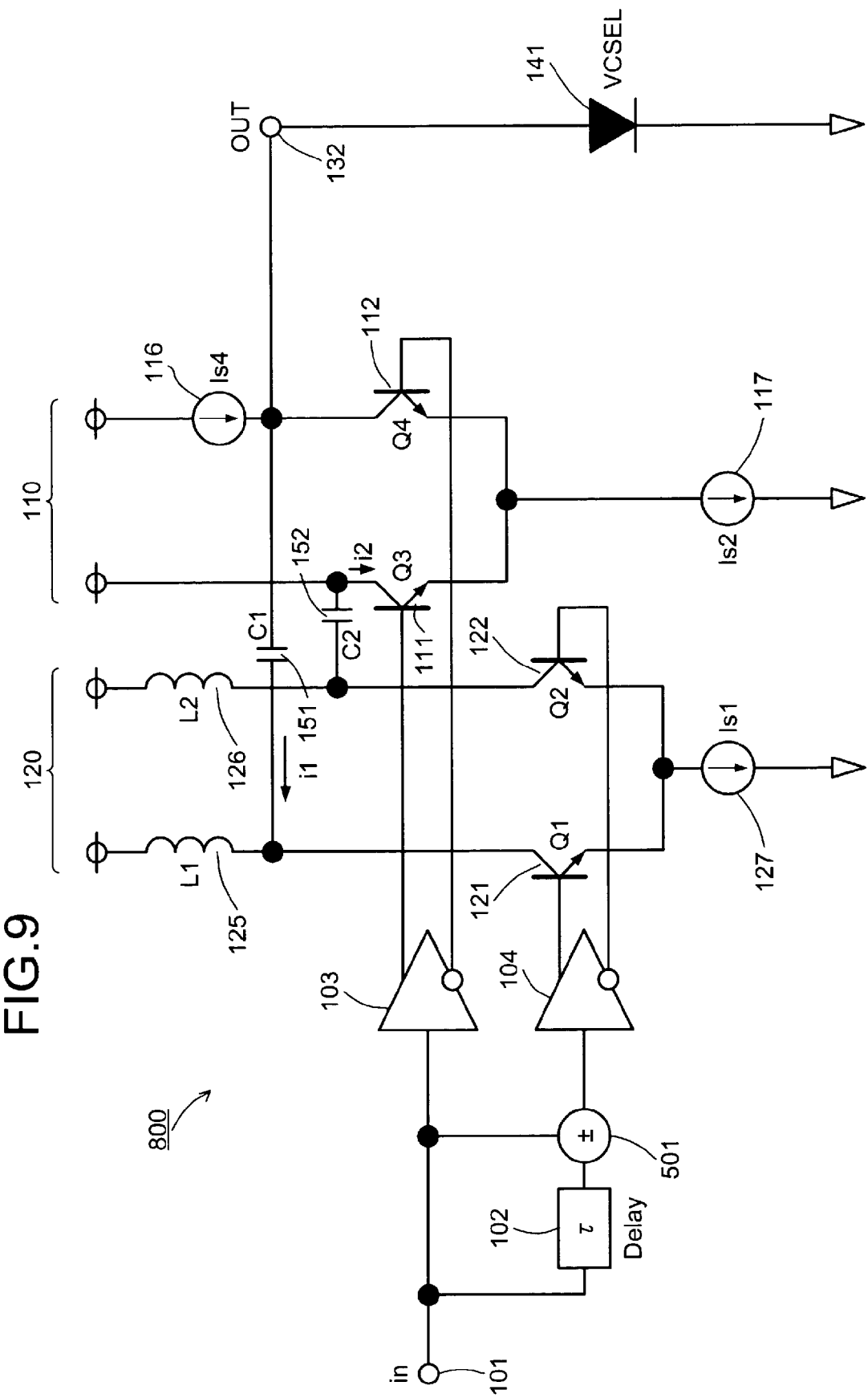
FIG. 9 is a circuit diagram of a modification of the signal shaping circuit according to the third embodiment.

FIG. 9 is a circuit diagram of a modification of the signal shaping circuit according to the third embodiment. In FIG. 9, only one current source 116 and one output terminal 132 are provided to drive the light-emitting element 141 to be driven. Configuration except above is the same as FIG. 8A. Reduced power consumption and reduced cost due to a reduced number of elements can be achieved by not providing the current source 115 depicted in FIG. 8A, while achieving the increase in operation speed similar to that of FIG. 8A.

Figure 10:
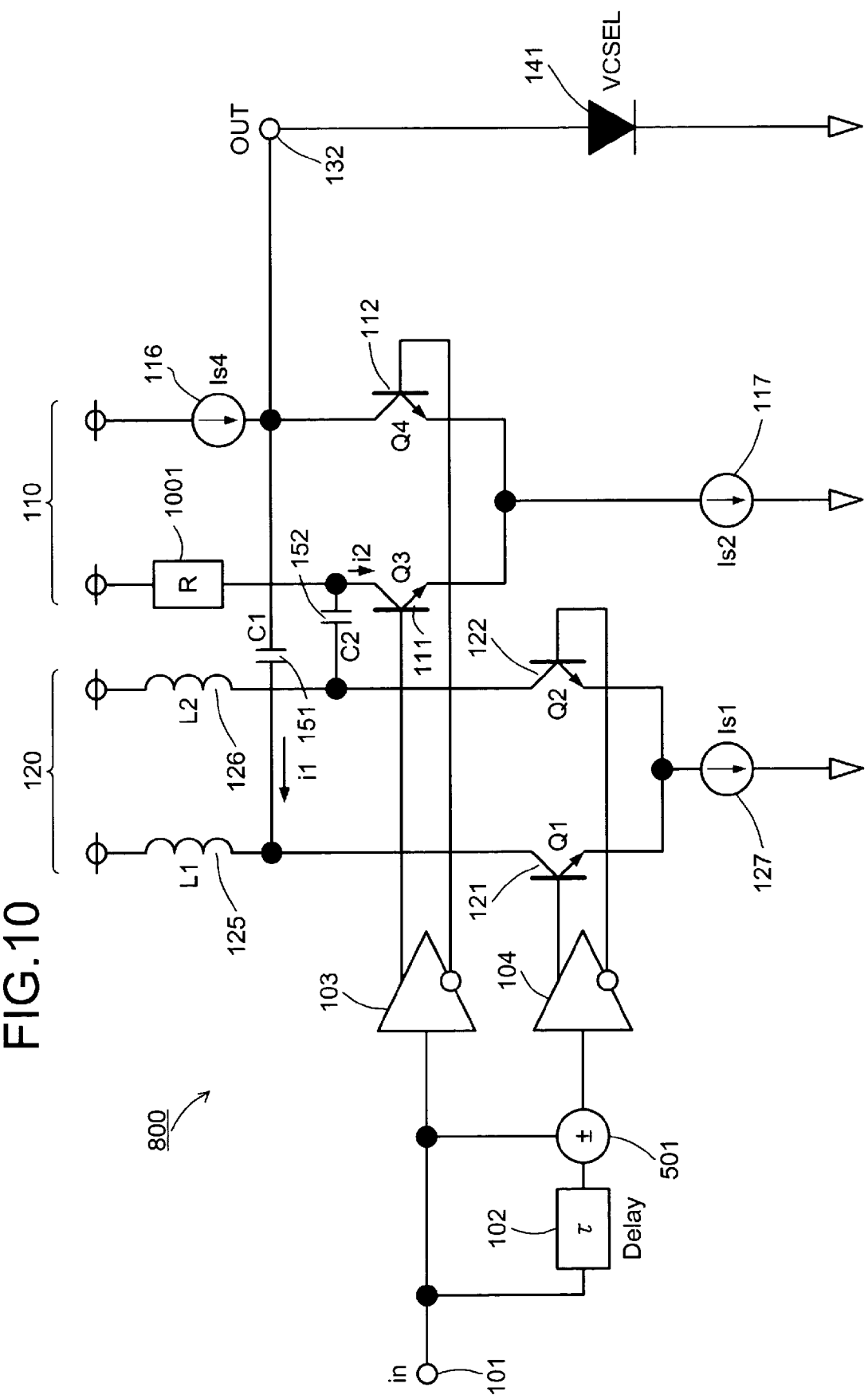
FIG. 10 is a circuit diagram of a modification the signal shaping circuit according to the third embodiment.

FIG. 10 is a circuit diagram of a modification of the signal shaping circuit according to the third embodiment. In FIG. 10, only one current source 116 and one output terminal 132 are provided to drive the light-emitting element 141 to be driven. Further, a resistor 1001 is provided in place of the current source 115 depicted in FIG. 8A. Configuration except above is the same as FIG. 8A. Reduced power consumption and reduced cost due to a reduced number of elements can be achieved by not providing the current source 115 depicted in FIG. 8A.

Further, the resistor 1001 provided on one of the differential pair and the light-emitting element 141 connected to the output terminal 132 as a load can be balanced. Furthermore, the design of the voltage between the collector and the emitter of the transistor 111 can be facilitated, while achieving the increase in operation speed similar to that of FIG. 8A.

Figure 11:
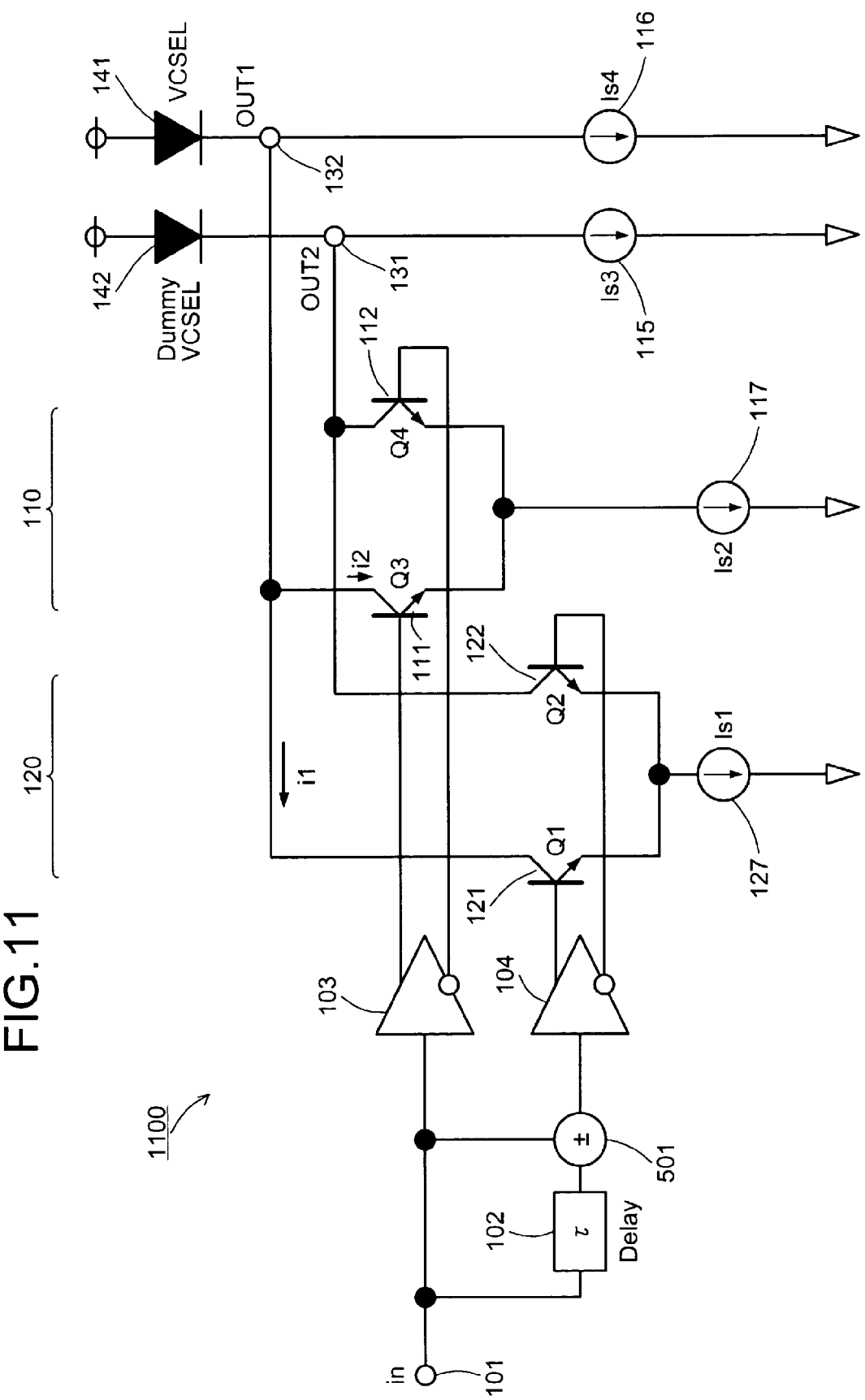
FIG. 11 is a circuit diagram of a signal shaping circuit according to a fourth embodiment.

FIG. 11 is a circuit diagram of a signal shaping circuit according to a fourth embodiment. The signal shaping circuit according to the fourth embodiment is of cathode-driving type, and cathodes of the light-emitting element to be driven and the dummy light-emitting element are connected to the output terminal. The configuration of a signal shaping circuit 1100 according to the fourth embodiment is basically the same as the anode-driving type according to the second embodiment (FIG. 5A), except that the cathode of the light-emitting element 141 to be driven is connected to the output terminal 132 and the cathode of the dummy light-emitting element 142 having characteristics equivalent to the light-emitting element 114 is connected to the output terminal 131. One ends of the current sources 115 and 116 are connected to the output terminals 131 and 132, respectively, and the other ends are grounded.

The configuration of the cathode-driving type depicted in FIG. 11 can be applied to the first to the third embodiments. Similar to the configuration of the anode-driving type according to the first to the third embodiments, increase in the amplitude, the amount of bias current, and the range of adjustment due to preemphasis can be suppressed in the configuration of the cathode-driving type according to the fourth embodiment, thereby achieving reduction of the bias current of the light-emitting element and increase in operation speed.

Figure 12A:
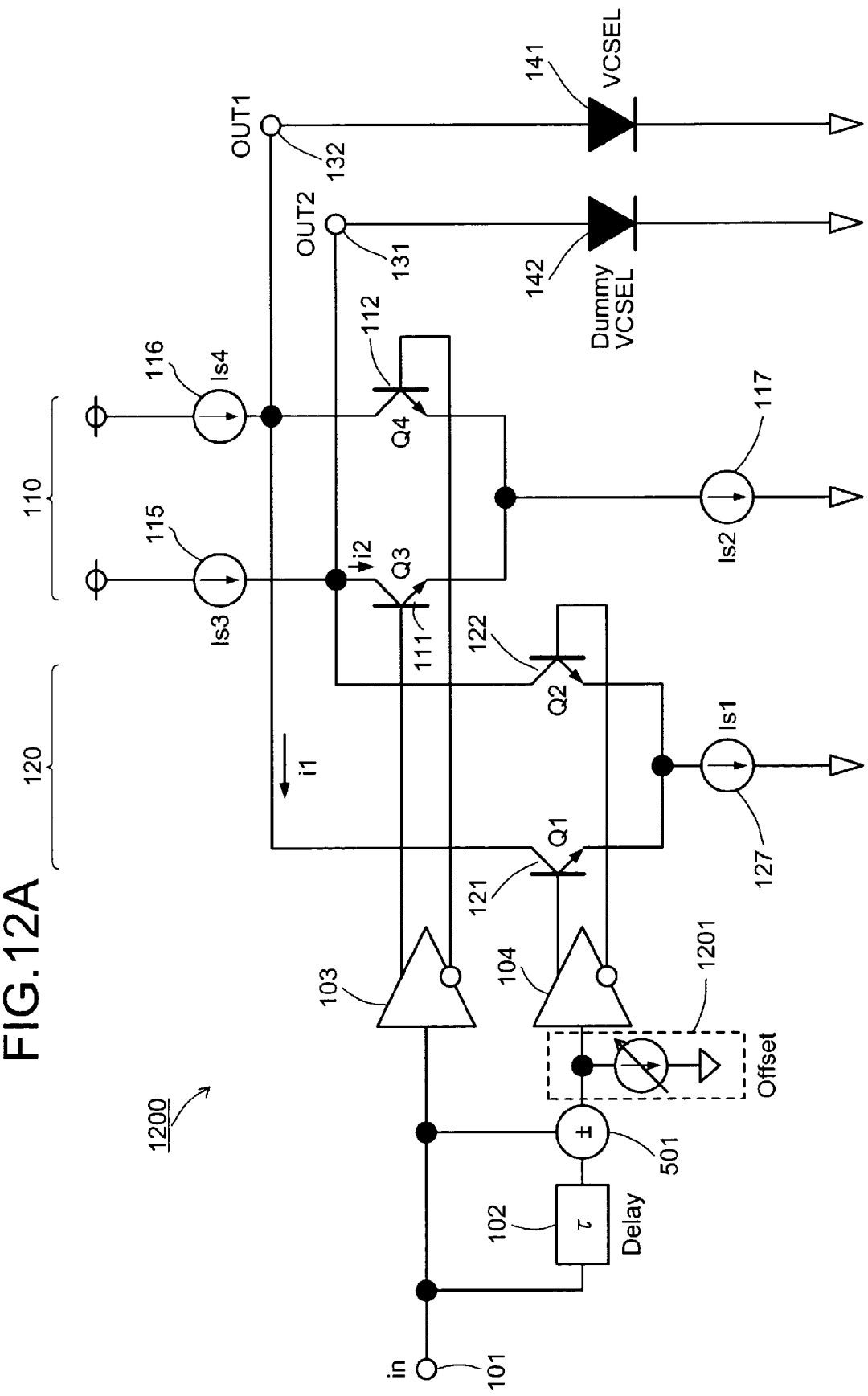
FIG. 12A is a circuit diagram of a signal shaping circuit according to a fifth embodiment.

FIG. 12A is a circuit diagram of a signal shaping circuit according to a fifth embodiment. A signal shaping circuit 1200 according to the fifth embodiment includes an offset circuit 1201 that adds a DC level offset to the emphasis signal generated by the preemphasis generating circuit 120. The offset circuit 1201 is a current source of which current value is variable, and one end of which is connected to a point between the subtracting unit 501 and the amplifier 104 and the other end is grounded.

FIG. 12B is a waveform diagram of currents at given positions in FIG. 12A. The value of the current i1 can be changed by the offset circuit 1201, and the waveform of the emphasis signal can be made asymmetric. Thus, the amount of the rise/fall of the preemphasis component in the waveform at the output terminal 132 can be adjusted. In the example depicted in FIG. 12B, the fall of the preemphasis component output from the output terminal 132 is emphasized. Alternatively, the rise and the fall of the preemphasis component output from the output terminal 132 can be adjusted to be symmetric.

According to the fifth embodiment, the rise and the fall of the preemphasis component can be adjusted to generate an asymmetric preemphasis component. Thus, the asymmetry of the rise and the fall of the light-emitting element 141 can be compensated.

The embodiments described above can achieve a faster circuit and a fast generation of the preemphasis signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal shaping circuit that shapes a drive signal, comprising:
   a main-signal amplifying circuit that amplifies the drive signal;
   a preemphasis generating circuit that symmetrically emphasizes a rising portion and a falling portion of the drive signal; and
   a current source that is provided in the main-signal amplifying circuit, and coupled to the main-signal amplifying circuit via a condenser so as to provide a direct current to elements in the main-signal amplifying circuit but not to elements in the preemphasis generating circuit.

2. The signal shaping circuit according to claim 1, wherein the main-signal amplifying circuit includes
   a differential pair that switches an output current and one output terminal of which is connected to a light-emitting element as a load; and
   a current source that adjusts an amount of a direct current with respect to the load, and
   the preemphasis generating circuit includes a differential pair that switches an output current and is connected to the current source.

3. The signal shaping circuit according to claim 1, wherein a current source on the side of one of the differential pair, the one being not connected to the load, is short-circuited to a power source.

4. The signal shaping circuit according to claim 1, wherein a resistor is short-circuited to a power source in place of a current source on the side of one of the differential pair, the one being not connected to the load.

5. The signal shaping circuit according to claim 1, wherein the signal shaping circuit is of anode-driving type in which an anode of a light-emitting element is connected to the output terminal.

6. The signal shaping circuit according to claim 1, wherein the signal shaping circuit is of cathode-driving type in which a cathode of a light-emitting element is connected to the output terminal.

7. A signal shaping circuit that shapes a drive signal, comprising:
   a main-signal amplifying circuit that includes therein a current source and amplifies the drive signal;
   a preemphasis generating circuit that symmetrically emphasizes a rising portion and a falling portion of the drive signal;
   a subtraction circuit that performs a subtraction of the input drive signal and a delay signal obtained by delaying the drive signal, and inputs a result of the subtraction to the preemphasis generating circuit; and
   an addition circuit that adds an output from the preemphasis generating circuit to an output from the main-signal amplifying circuit.

8. The signal shaping circuit according to claim 7, wherein the main-signal amplifying circuit includes
   a differential pair that switches an output current and one output terminal of which is connected to a light-emitting element as a load; and a current source that adjusts an amount of a direct current with respect to the load, and the preemphasis generating circuit includes a differential pair that switches an output current and is connected to the current source.

9. The signal shaping circuit according to claim 7, wherein a current source on the side of one of the differential pair, the one being not connected to the load, is short-circuited to a power source.

10. The signal shaping circuit according to claim 7, wherein a resistor is short-circuited to a power source in place of a current source on the side of one of the differential pair, the one being not connected to the load.

11. The signal shaping circuit according to claim 7, further comprising an offset circuit that sets a DC level offset with respect to an output value of the subtraction circuit.

12. The signal shaping circuit according to claim 7, wherein the signal shaping circuit is of anode-driving type in which an anode of a light-emitting element is connected to the output terminal.

13. The signal shaping circuit according to claim 7, wherein the signal shaping circuit is of cathode-driving type in which a cathode of a light-emitting element is connected to the output terminal.

14. A signal shaping circuit that shapes a drive signal, comprising:
   a main-signal amplifying circuit that amplifies the drive signal;
   a preemphasis generating circuit that symmetrically emphasizes a rising portion and a falling portion of the drive signal;
   a current source that is provided in the main-signal amplifying circuit, and coupled to the main-signal amplifying circuit via a condenser so as to provide a direct current to elements in the main-signal amplifying circuit but not to elements in the preemphasis generating circuit;
   a subtraction circuit that performs a subtraction of the input drive signal and a delay signal obtained by delaying the drive signal, and input a result of the subtraction to the preemphasis generating circuit; and
   an addition circuit that adds an output from the preemphasis generating circuit to an output from the main-signal amplifying circuit.

15. The signal shaping circuit according to claim 14, wherein
   the main-signal amplifying circuit includes
      a differential pair that switches an output current and one output terminal of which is connected to a light-emitting element as a load; and
      a current source that adjusts an amount of a direct current with respect to the load, and
   the preemphasis generating circuit includes a differential pair that switches an output current and is connected to the current source.

16. The signal shaping circuit according to claim 14, wherein a current source on the side of one of the differential pair, the one being not connected to the load, is short-circuited to a power source.

17. The signal shaping circuit according to claim 14, wherein a resistor is short-circuited to a power source in place of a current source on the side of one of the differential pair, the one being not connected to the load.

18. The signal shaping circuit according to claim 14, further comprising an offset circuit that sets a DC level offset with respect to an output value of the subtraction circuit.

19. The signal shaping circuit according to claim 14, wherein the signal shaping circuit is of anode-driving type in which an anode of a light-emitting element is connected to the output terminal.

20. The signal shaping circuit according to claim 14, wherein the signal shaping circuit is of cathode-driving type in which a cathode of a light-emitting element is connected to the output terminal.

* * * * *